US012564021B2

(12) United States Patent
Narayanan et al.

(10) Patent No.: US 12,564,021 B2
(45) Date of Patent: Feb. 24, 2026

(54) METHOD OF PROCESSING A SUBSTRATE

(71) Applicant: Applied Materials, Inc., Santa Clara, CA (US)

(72) Inventors: Rajaram Narayanan, Santa Clara, CA (US); Fang Ruan, Milpitas, CA (US); Prashant Kumar Kulshreshtha, San Jose, CA (US); Diwakar N. Kedlaya, San Jose, CA (US); Karthik Janakiraman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 655 days.

(21) Appl. No.: 16/790,563

(22) Filed: Feb. 13, 2020

(65) Prior Publication Data

US 2020/0266064 A1     Aug. 20, 2020

Related U.S. Application Data

(60) Provisional application No. 62/805,433, filed on Feb. 14, 2019.

(51) Int. Cl.
H01L 21/033     (2006.01)
C23C 16/30     (2006.01)
(Continued)

(52) U.S. Cl.
CPC .......... H01L 21/0332 (2013.01); C23C 16/30 (2013.01); C23C 16/505 (2013.01);
(Continued)

(58) Field of Classification Search
CPC ......... H01L 21/02112; H01L 21/02205; H01L 21/02274; H01L 21/0332; C23C 16/30;
(Continued)

(56) References Cited

U.S. PATENT DOCUMENTS 8,536,065 B2     9/2013   Seamons et al.
9,852,923 B2     12/2017  Lee et al.
(Continued)

FOREIGN PATENT DOCUMENTS

CN         103210480 A      7/2013
CN         104285304 A      1/2015
(Continued)

OTHER PUBLICATIONS

International Search Report and the Written Opinion of the International Searching Authority for PCT/US2020/018120 mailed Jun. 11, 2020, 10 pages.
(Continued)

*Primary Examiner* — Brook Kebede
(74) *Attorney, Agent, or Firm* — Patterson + Sheridan, LLP

(57)     ABSTRACT

Embodiments of the present disclosure generally relate to a method of processing a substrate. The method includes exposing the substrate positioned in a processing volume of a processing chamber to a hydrocarbon-containing gas mixture, exposing the substrate to a boron-containing gas mixture, and generating a radio frequency (RF) plasma in the processing volume to deposit a boron-carbon film on the substrate. The hydrocarbon-containing gas mixture and the boron-containing gas mixture are flowed into the processing volume at a precursor ratio of (boron-containing gas mixture/((boron-containing gas mixture)+hydrocarbon-containing gas mixture) of about 0.38 to about 0.85. The boron-carbon hardmask film provides high modulus, etch selectivity, and stress for high aspect-ratio features (e.g., 10:1 or above) and smaller dimension devices (e.g., 7 nm node or below).

24 Claims, 4 Drawing Sheets

(51) Int. Cl.
   *C23C 16/505*        (2006.01)
   *H01J 37/32*        (2006.01)
   *H01L 21/02*        (2006.01)

(52) U.S. Cl.
   CPC .. *H01J 37/32082* (2013.01); *H01J 37/32715*
   (2013.01); *H01L 21/02205* (2013.01); *H01L*
   *21/02274* (2013.01); *H01J 2237/2007*
   (2013.01); *H01J 2237/3321* (2013.01)

(58) Field of Classification Search
   CPC .. C23C 16/32; C23C 16/505; H01J 37/32082;
   H01J 37/32715
   USPC ........................................................ 438/778
   See application file for complete search history.

(56)                References Cited

U.S. PATENT DOCUMENTS

| | | | |
|---|---|---|---|
| 10,418,243 | B2 | 9/2019 | Kulshreshtha et al. |
| 2004/0259355 | A1 | 12/2004 | Yin et al. |
| 2012/0080779 | A1* | 4/2012 | Seamons ............. C23C 16/0272 |
| | | | 257/E21.24 |
| 2014/0017897 | A1 | 1/2014 | Seamons et al. |
| 2015/0122421 | A1 | 5/2015 | Konno et al. |
| 2015/0371851 | A1 | 12/2015 | Lee et al. |
| 2017/0103893 | A1* | 4/2017 | Kulshreshtha .... H01L 21/02112 |
| 2017/0365450 | A1* | 12/2017 | Bi ...................... H01J 37/32862 |
| 2018/0076042 | A1 | 3/2018 | Cheng et al. |

FOREIGN PATENT DOCUMENTS

| | | | |
|---|---|---|---|
| CN | 104513973 | A | 4/2015 |
| CN | 108140545 | A | 6/2018 |
| KR | 20070004009 | A | 1/2007 |
| KR | 10-2018-0053766 | A | 5/2018 |
| TW | 201704513 | A | 2/2017 |
| TW | 201718918 | A | 6/2017 |
| TW | 201724253 | A | 7/2017 |
| TW | 201730962 | A | 9/2017 |

OTHER PUBLICATIONS

International Search Report and Written Opinion of the International Searching Authority for Application No. 11202108054W dated Feb. 10, 2023.
International Search Report and the Written Opinion of the International Searching Authority for Application No. 11202108054W dated Sep. 21, 2023.
Taiwan Office Action for Application No. 109104687 dated Sep. 20, 2023.
JP Office Action dated Jan. 23, 2024 for JP Patent Application No. 2021-547458.
Chinese Office Action dated Mar. 26, 2025 for Application No. 202080014477.9.
Chinese Office Action issued to Application No. 202080014477.9 on Jul. 6, 2024 in 12 pages.
Korean Office Action dated Apr. 25, 2024 for Application No. 10-2021-7029486.
Taiwan Office Action dated Jun. 3, 2024 for Application No. 109104687.
Chinese Office Action dated Jan. 15, 2025 for Application No. 202080014477.9.

* cited by examiner

METHOD OF PROCESSING A SUBSTRATE

CROSS-REFERENCE TO RELATED APPLICATIONS

This application claims priority to U.S. Provisional Patent Application No. 62/805,433, filed Feb. 14, 2019, which is hereby incorporated by reference in its entirety.

FIELD

Embodiments of the present disclosure generally relate a method and, more specifically, to a method of processing a substrate.

BACKGROUND

The demands for greater integrated circuit densities impose demands on the process sequences used in the manufacture of integrated circuit components. For example, in process sequences that use conventional photolithographic techniques, a layer of energy sensitive resist is formed over a stack of material layers disposed on a substrate. The energy sensitive resist layer is exposed to an image of a pattern to form a photoresist mask. Thereafter, the mask pattern is transferred to one or more of the material layers of the stack using an etch process. The chemical etchant used in the etch process is selected to have a greater etch selectivity for the material layers of the stack than for the mask of energy sensitive resist. The etch selectivity to the one or more material layers of the stack over the resist layer prevents the energy sensitive resist layer from being consumed prior to completion of the pattern transfer.

As the pattern dimensions are reduced, the thickness of the energy sensitive resist is correspondingly reduced in order to control pattern resolution. Such thin resist layers can be insufficient to mask underlying material layers during the pattern transfer operation due to attack by the chemical etchant. An intermediate layer, called a hardmask, is often used between the energy sensitive resist layer and the underlying material layers to facilitate pattern transfer because of greater resistance of the hardmask to the chemical etchant. As critical dimensions (CD) decrease, current hardmask materials lack the desired etch selectivity relative to underlying materials.

Therefore there is a need for methods for depositing hardmask films with improved etch selectivity.

SUMMARY

Embodiments included herein include methods of processing a substrate. The methods include depositing a boron-carbon film, and the boron-carbon film exhibits improved etch selectivity.

In one embodiment, a method of processing a substrate is provided. The method includes exposing the substrate positioned in a processing volume of a processing chamber to a hydrocarbon-containing gas mixture, exposing the substrate to a boron-containing gas mixture, and generating a radio frequency (RF) plasma in the processing volume to deposit a boron-carbon film on the substrate. The hydrocarbon-containing gas mixture and the boron-containing gas mixture are flowed into the processing volume at a precursor ratio of (boron-containing gas mixture/((boron-containing gas mixture)+hydrocarbon-containing gas mixture) of about 0.38 to about 0.85. The boron-carbon film has about 55 atomic percentage to about 95 atomic percentage of boron.

In another embodiment, a method of processing a substrate is provided. The method includes exposing the substrate positioned in a processing volume of a processing chamber to a hydrocarbon-containing gas mixture, exposing the substrate to a boron-containing gas mixture, and generating a radio frequency (RF) plasma in the processing volume to deposit a boron-carbon film on the substrate. The hydrocarbon-containing gas mixture and the boron-containing gas mixture are flowed into the processing volume at a precursor ratio of (boron-containing gas mixture/((boron-containing gas mixture)+hydrocarbon-containing gas mixture) of about 0.38 to about 0.85. The boron-carbon film has about 35 atomic percentage to about 55 atomic percentage of boron.

In yet another embodiment, a method of processing a substrate is provided. The method includes exposing the substrate positioned in a processing volume of a processing chamber to a hydrocarbon-containing gas mixture, exposing the substrate to a boron-containing gas mixture, and generating a radio frequency (RF) plasma in the processing volume to deposit a boron-carbon film on the substrate. The hydrocarbon-containing gas mixture and the boron-containing gas mixture are flowed into the processing volume at a precursor ratio of (boron-containing gas mixture/((boron-containing gas mixture)+hydrocarbon-containing gas mixture) of about 0.38 to about 0.85. The hydrocarbon-containing gas mixture includes propylene ($C_3H_6$). The boron-carbon film has about 55 atomic percentage to about 95 atomic percentage of boron.

BRIEF DESCRIPTION OF THE DRAWINGS

So that the manner in which the above-recited features of the present disclosure can be understood in detail, a more particular description of the embodiments, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the present disclosure generally relate to a method of processing a substrate. The present disclosure describes techniques for deposition of hardmasks (e.g., boron-carbon films) with high modulus and etch selectivity on a substrate. The method includes the fabrication of high-density boron-carbon hardmask films with increased concentration of boron and lower incorporated hydrogen. Decreasing a flow rate of a hydrocarbon-containing gas source increases the percentage of boron (B %) in the boron-carbon hardmask films. The boron-carbon hardmask films provide high modulus, etch selectivity, and stress for high aspect-ratio features (e.g., 10:1 or above) and smaller dimension devices (e.g., 7 nm node or below). Embodiments described herein are compatible with current carbon hard mask process integration schemes. Thus, introduction of the methods into existing device manufacturing lines will not require substantial changes in upstream or downstream processing methods or equipment related thereto. Embodiments disclosed herein may be useful for, but are not limited to, deposition of boron-carbon hardmasks.

As used herein, the term "about" refers to a +/−10% variation from the nominal value. It is to be understood that such a variation can be included in any value provided herein.

Embodiments described herein will be described below in reference to a plasma enhanced chemical vapor deposition (PECVD) process that can be carried out using any suitable thin film deposition system. Examples of suitable systems include the CENTURA® systems which can use a DxZ™ processing chamber, PRECISION 5000® systems, PRO-DUCER™ systems, PRODUCER GT™ and the PRODUC-ERSE™ processing chambers which are commercially available from Applied Materials, Inc., of Santa Clara, Calif. Other tools capable of performing PECVD processes can also be adapted to benefit from the embodiments described herein. In addition, any system enabling the PECVD processes described herein can be used to advantage. The apparatus description described herein is illustrative and should not be construed or interpreted as limiting the scope of the embodiments described herein.

Figure 1:
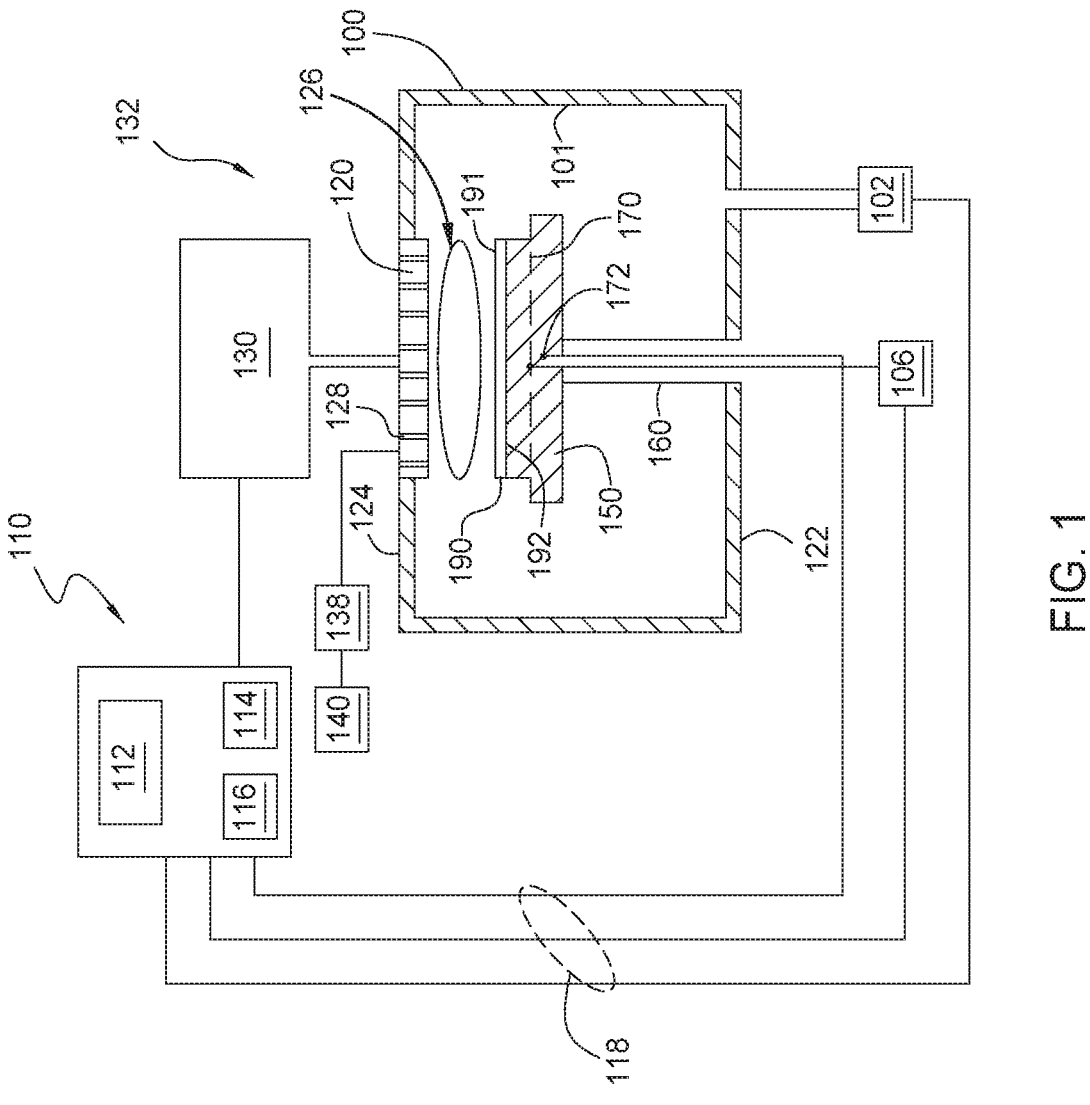
FIG. 1 illustrates a schematic view of a substrate processing system, according to one embodiment.

FIG. 1 illustrates a schematic view of a substrate processing system 132, according to one embodiment. The substrate processing system 132 is configured to perform hardmask layer deposition. As shown, the substrate processing system 132 includes a processing chamber 100 coupled to a gas panel 130 and a controller 110.

The processing chamber 100 is configured to perform a variety of processing methods on a substrate 190 disposed within. For example, the processing chamber 100 is configured to deposit a hardmask on the substrate 190. As shown, the processing chamber 100 includes a top wall 124, one or more side walls 101, and a bottom wall 122 that define an interior processing volume 126. A support pedestal 150, for supporting the substrate 190, is positioned in the interior processing volume 126 of the processing chamber 100. The support pedestal 150 is supported by a stem 160, and the support pedestal 150 and/or stem 160 can include aluminum, ceramic, and any other suitable materials, such as stainless steel. The support pedestal 150 can be moved in a vertical direction inside the processing chamber 100 using a displacement mechanism (not shown) (e.g., an actuator that raises and lowers the support pedestal). In some embodiments, the support pedestal 150 includes an electrostatic chuck (ESC). The ESC secures the substrate 190 during processing.

The support pedestal 150 can include an heater element 170 embedded in the support pedestal 150. The heater element 170 is configured to control the temperature of the substrate 190 supported on a surface 192 of the support pedestal 150. The support pedestal 150 can be resistively heated by applying an electric current from a power supply 106 to the heater element 170. The electric current supplied from the power supply 106 is regulated by the controller 110 to control the heat generated by the heater element 170, thus maintaining the substrate 190 and the support pedestal 150 at a substantially constant temperature during film deposition. The supplied electric current is adjusted to selectively control the temperature of the support pedestal 150 between about 400° C. and about 700° C.

A temperature sensor 172, such as a thermocouple, can be embedded in the support pedestal 150 to monitor the temperature of the support pedestal 150. The measured temperature is used by the controller 110 to control the power supplied to the embedded heater element 170 to maintain the substrate 190 at a desired temperature.

A vacuum pump 102 is coupled to a port formed in the bottom wall 122 of the processing chamber 100. The vacuum pump 102 is used to maintain a desired gas pressure in the processing chamber 100. The vacuum pump 102 also evacuates post-processing gases and by-products of the process from the processing chamber 100.

A gas distribution assembly 120 having a plurality of apertures 128 is disposed on the top of the processing chamber 100 above the support pedestal 150. The gas distribution assembly 120 is configured to flow one or more process gases into the processing chamber 100. The apertures 128 can have different sizes, number, distributions, shape, design, and diameters to facilitate the flow of the various process gases into the processing chamber 100. The gas distribution assembly 120 is connected to the gas panel 130 that supplies various gases to the interior processing volume 126 during substrate processing. Plasma can be formed from the process gas mixture exiting the gas distribution assembly 120 to enhance thermal decomposition of the process gases, resulting in the deposition of material on a surface 191 of the substrate 190.

The gas distribution assembly 120 and the support pedestal 150 can form a pair of spaced electrodes in the interior processing volume 126. One or more radio frequency (RF) power sources 140 provides a bias potential through a matching network 138 to the gas distribution assembly 120 to facilitate generation of plasma between the gas distribution assembly 120 and the support pedestal 150. Alternatively, the RF power sources 140 and matching network 138 are coupled to the gas distribution assembly 120, the support pedestal 150, or coupled to both the gas distribution assembly 120 and the support pedestal 150, or coupled to an antenna (not shown) disposed exterior to the processing chamber 100. In one embodiment, the RF power sources 140 provide between about 100 W and about 3,000 W at a frequency of about 50 kHz to about 13.6 MHz. In another embodiment, the RF power sources 140 provide between about 500 W and about 1,800 W at a frequency of about 50 kHz to about 13.6 MHz.

As shown, the controller 110 includes a central processing unit (CPU) 112, a memory 116, and a support circuit 114 configured to control the process sequence and regulate the gas flows from the gas panel 130. The CPU 112 is any form of a general-purpose computer processor that is used in an industrial setting. The software routines can be stored in the memory 116, such as random access memory, read only memory, floppy, or hard disk drive, or other form of digital storage. The support circuit 114 is conventionally coupled to the CPU 112 and can include cache, clock circuits, input/output systems, power supplies, and the like. Bi-directional communications between the controller 110 and the various components of the substrate processing system 132 are handled through numerous signal cables collectively referred to as signal buses 118.

Figure 2:
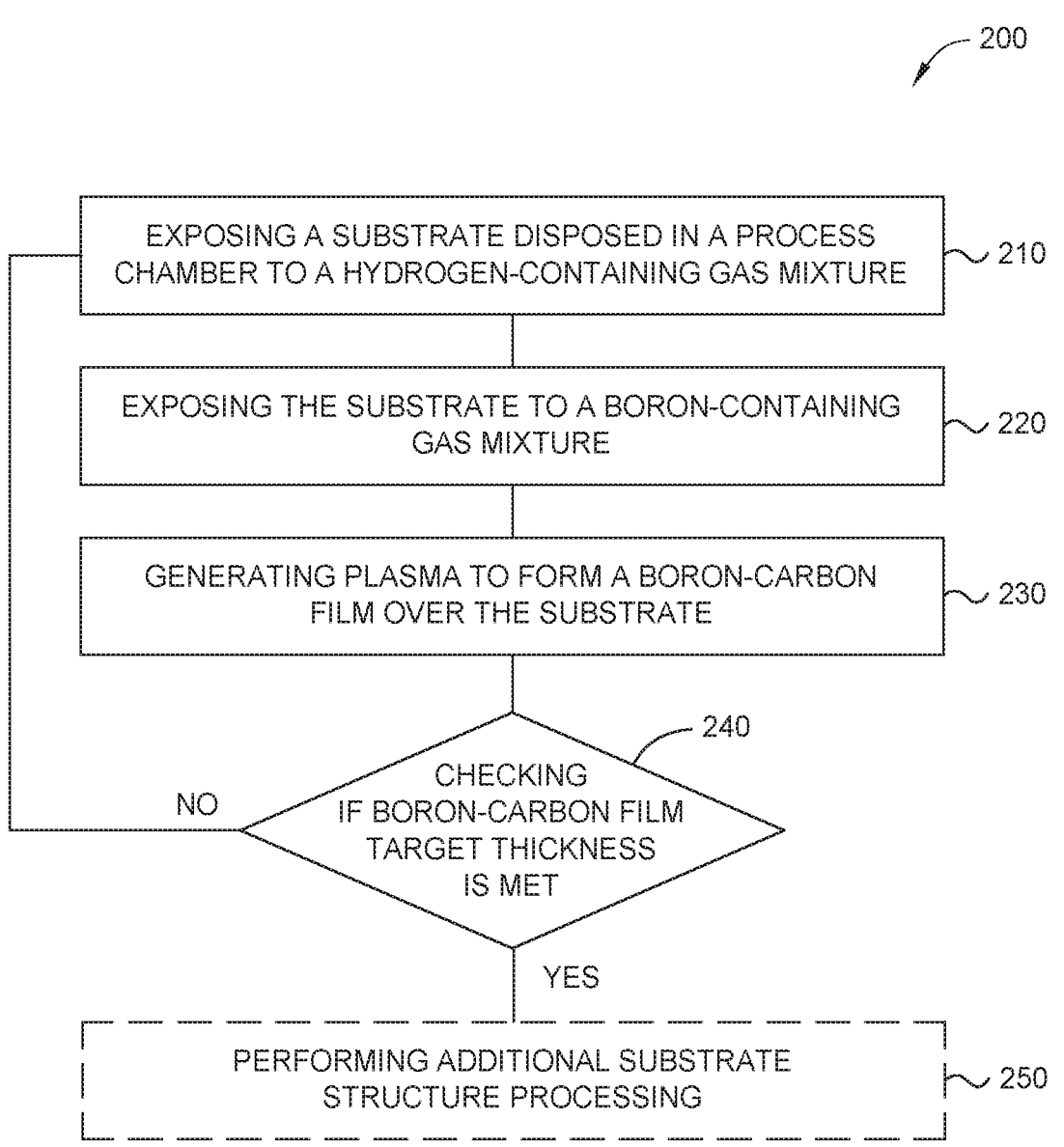
FIG. 2 is a flow diagram of method operations for depositing a boron-carbon film, according to one embodiment.

FIG. 2 is a flow diagram of method 200 operations for depositing a boron-carbon film, according to one embodiment. Although the method 200 operations are described in conjunction with FIGS. 2 and 3, persons skilled in the art will understand that any system configured to perform the method operations, in any order, falls within the scope of the embodiments described herein. The method 200 can be stored or accessible to the controller 110 as computer readable media containing instructions, that when executed by the CPU 112 of the controller, cause the system 132 and/or processing chamber 100 to perform the method 200.

Figure 3:
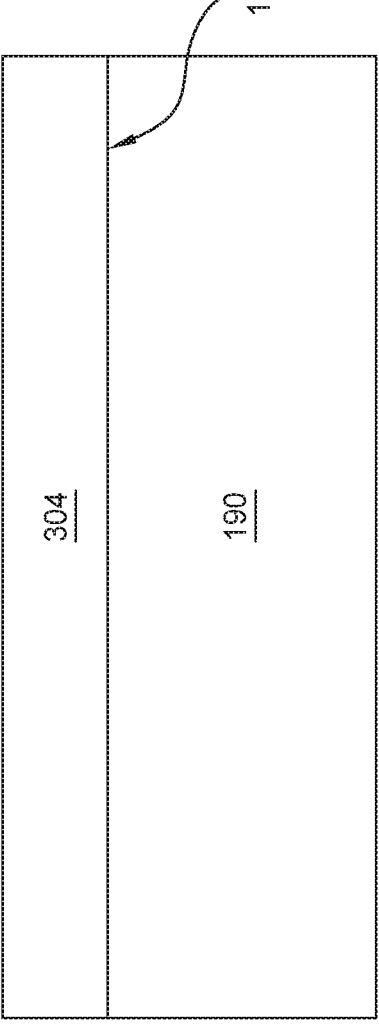
FIG. 3 illustrates a schematic cross-sectional view of a substrate structure, according to one embodiment.

The method 200 begins at operation 210, where a substrate disposed in a processing volume of a processing chamber is exposed to a hydrocarbon-containing gas. The processing chamber can be the processing chamber 100 depicted in FIG. 1. FIG. 3 illustrates a schematic cross-sectional view of a substrate structure 300, according to one embodiment. As shown, the substrate structure 300 includes the substrate 190. The substrate 190 can have a substantially planar surface 191 having a structure formed thereon or therein at a desired elevation. Alternatively, the substrate 190 can have patterned structures, for example, a surface having trenches, holes, or vias formed therein. While the substrate 190 is illustrated as a single body in FIG. 3, it is understood that the substrate 190 can contain one or more materials used in forming semiconductor devices, such as metal contacts, trench isolations, gates, bitlines, or any other interconnect features. The substrate 190 can include any number or combination of metallic, semiconducting, and/or insulating layers thereon.

The substrate 190 can include one or more metal layers, one or more dielectric materials, semiconductor material, and combinations thereof utilized to fabricate semiconductor devices. For example, the substrate 190 includes an oxide material, a nitride material, a polysilicon material, or the like, depending upon application. In one embodiment where a memory application is desired, the substrate 190 includes the silicon substrate material, an oxide material, and a nitride material, with or without polysilicon sandwiched in between.

In another embodiment, the substrate 190 includes a plurality of alternating oxide and nitride materials (i.e., oxide-nitride-oxide (ONO)) deposited on the surface 191 of the substrate 190. In various embodiments, the substrate 190 includes a plurality of alternating oxide and nitride materials, one or more oxide or nitride materials, polysilicon or amorphous silicon materials, oxides alternating with amorphous silicon, oxides alternating with polysilicon, undoped silicon alternating with doped silicon, undoped polysilicon alternating with doped polysilicon, or undoped amorphous silicon alternating with doped amorphous silicon. The substrate 190 can be any substrate or material surface upon which film processing is performed. For example, the substrate 190 can include crystalline silicon, silicon oxide, silicon oxynitride, silicon nitride, strained silicon, silicon germanium, tungsten, titanium nitride, doped or undoped polysilicon, doped or undoped silicon wafers and patterned or non-patterned wafers, silicon on insulator (SOI), carbon doped silicon oxides, silicon nitrides, doped silicon, germanium, gallium arsenide, glass, sapphire, low-k dielectrics, and combinations thereof.

The hydrocarbon-containing gas mixture is flowed from the gas panel 130 into the interior processing volume 126 through the gas distribution assembly 120. The gas mixture includes at least one hydrocarbon compound. The gas mixture can further include an inert gas, a dilution gas, or combinations thereof. The hydrocarbon can be any gas or liquid that can be vaporized to simplify the hardware needed for material metering, control and delivery to the chamber. In one embodiment, the hydrocarbon source is a gaseous hydrocarbon, such as a linear hydrocarbon. In one embodiment, the hydrocarbon compound has a general formula $C_xH_y$, where x has a range of between 1 and 20 and y has a range of between 1 and 20. In one embodiment, the hydrocarbon compound is an alkane. Suitable hydrocarbon compounds include, for example, alkanes such as methane ($CH_4$), ethane ($C_2H_6$), propylene ($C_3H_6$), propane ($C_3H_8$), butane ($C_4H_{10}$) and its isomer isobutane, pentane ($C_5H_{12}$), hexane ($C_6H_{14}$) and its isomers isopentane and neopentane, hexane ($C_6H_{14}$) and its isomers 2-methylpentane, 3-methylpentane, 2,3-dimethylbutane, and 2,2-dimethyl butane, or combinations thereof. Additional suitable hydrocarbons include, for example, alkenes, such as acetylene, ethylene, propylene, butylene and its isomers, pentene and its isomers, and the like, dienes such as butadiene, isoprene, pentadiene, hexadiene, or combinations thereof.

Additional suitable hydrocarbons include, for example, halogenated alkenes such as monofluoroethylene, difluoroethylenes, trifluoroethylene, tetrafluoroethylene, monochloroethylene, dichloroethylenes, trichloroethylene, tetrachloroethylene, or combinations thereof. Additional suitable hydrocarbons include, for example, alkynes such as acetylene ($C_2H_2$), propyne ($C_3H_4$), butylene ($C_4H_8$), vinylacetylene, or combinations thereof. Additional suitable hydrocarbons include, for example, aromatic hydrocarbons, such as benzene, styrene, toluene, xylene, ethylbenzene, acetophenone, methyl benzoate, phenyl acetate, phenol, cresol, furan, and the like, alpha-terpinene, cymene, 1,1,3,3,-tetramethyl-butylbenzene, t-butylether, t-butylethylene, methyl-methacrylate, and t-butylfurfurylether, compounds having the formula $C_3H_2$ and $C_5H_4$, halogenated aromatic compounds including monofluorobenzene, difluorobenzenes, tetrafluorobenzenes, hexafluorobenzene, or combinations thereof. In some examples, $C_3H_6$ is found to be advantageous due to formation of more stable intermediate species which allows more surface mobility.

The flow rate of the hydrocarbon-containing gas mixture can be from about 2,000 sccm to about 4,500 sccm, for example, about 2,200 sccm to about 4,000 sccm. In one embodiment where $C_3H_6$ is used as the hydrocarbon-containing gas source, the flow rate of the hydrocarbon-containing gas mixture is from about 2,250 sccm to about 3,000 sccm, such as from about 2,300 sccm to about 2,800 sccm.

Suitable dilution gases such as helium (He), argon (Ar), hydrogen gas ($H_2$), nitrogen gas ($N_2$), ammonia ($NH_3$), or combinations thereof, among others, can be added to the gas mixture, if desired. Ar, He, and $N_2$ are used to control the density and deposition rate of the amorphous carbon layer. Alternatively, dilution gases are not used during the deposition.

In some cases, a nitrogen-containing gas is supplied with the hydrocarbon-containing gas mixture into the processing chamber 100 to control the hydrogen ratio of the amorphous carbon layer. Suitable nitrogen-containing compounds include, for example, nitrogen gas, ammonia, pyridine, aliphatic amine, amines, nitriles, and similar compounds.

An inert gas, such as argon (Ar) and/or helium (He) can be supplied with the hydrocarbon-containing gas mixture into the processing chamber 100. Other inert gases, such as nitrogen gas ($N_2$), can also be used to control the density and deposition rate of the amorphous carbon layer. Additionally, a variety of other processing gases can be added to the gas mixture to modify properties of the amorphous carbon material. In one embodiment, the processing gases include reactive gases, such as hydrogen gas ($H_2$), ammonia ($NH_3$), a mixture of hydrogen gas ($H_2$) and nitrogen gas ($N_2$) (also known as forming gas), or combinations thereof. The addition of $H_2$ and/or $NH_3$ is used to control the hydrogen ratio (e.g., carbon to hydrogen ratio) of the deposited amorphous carbon layer. The hydrogen ratio present in the amorphous carbon film provides control over layer properties, such as reflectivity.

At operation 220, the substrate 190 is exposed to a boron-containing gas mixture. The boron-containing gas mixture is flowed from the gas panel 130 into the interior processing volume 126 through the gas distribution assembly 120. In one embodiment, the boron-containing gas mixture includes a boron-containing compound and a dilution gas. Examples of boron-containing compounds include diborane ($B_2H_6$), trimethyl boronane [TMB] ($B(CH_3)_3$), triethylborane [TEB] ($B(C_2H_5)_3$), methyl borane, dimethyl borane, ethyl borane, diethyl borane, ortho-carborane ($C_2B_{10}H_{12}$), and similar compounds. Suitable dilution gases such as hydrogen gas ($H_2$), helium (He), argon (Ar), nitrogen gas ($N_2$), ammonia ($NH_3$), or combinations thereof, among others, can be included. In one example, the boron-containing gas mixture includes $B_2H_6$ and $H_2$.

In one embodiment, the percentage of boron-containing compound in the total boron-containing gas mixture is from about 1 weight percentage (wt. %) to about 20 wt. %, e.g., from about 2 wt. % to about 18 wt. %, such as from about 5 wt. % to about 12 wt. %, for example about 7 wt. % to about 12 wt. %. Exemplary boron-containing gas mixtures include, for example, 6 wt. % $B_2H_6$/94 wt. % $H_2$, 7 wt. % $B_2H_6$/93 wt. % $H_2$, 8 wt. % $B_2H_6$/92 wt. % $H_2$, 9 wt. % $B_2H_6$/91 wt. % $H_2$, 10 wt. % $B_2H_6$/90 wt. % $H_2$, 11 wt. % $B_2H_6$/89 wt. % $H_2$ or 12 wt. % $B_2H_6$/88 wt. % $H_2$. The hydrogen gas in these exemplary examples can be replaced with He, Ar, or $N_2$. It is contemplated that when different concentrations of boron-containing gas mixtures are used, the flow rate needed to achieve certain film properties can change accordingly.

In various embodiments where $C_3H_6$ is used as the hydrocarbon-containing gas source and 9 wt. % $B_2H_6$ diluted in $H_2$ is used as the boron-containing gas source, a ratio of the flowrate (hereafter ratio) of the hydrocarbon-containing gas source to the boron-containing gas source can be in a range between about 0.05:1 and about 0.13:1, such as between about 0.07:1 and about 0.12:1, for example about 0.9:1 to about 0.11:1.

In one embodiment where 9 wt. % diborane diluted in $H_2$ is used as the boron-containing gas source, the flow rate of the boron-containing gas mixture varies from about 1,000 sccm to about 10,000 sccm, such as about 1,800 sccm to about 3,500 sccm, for example, about 2,300 sccm. In another embodiment where 6% diborane diluted in $H_2$ is used as the boron-containing gas source, the flow rate of the boron-containing gas mixture is from about 5,000 sccm to about 15,000 sccm, for example, about 13,000 sccm. In yet another embodiment where 12% diborane diluted in $H_2$ is used as the boron-containing gas source, the flow rate of the boron-containing gas mixture is from about 2,000 sccm to about 8,000 sccm, for example about 2,200 sccm to about 7,500 sccm.

The hydrocarbon-containing gas mixture can be introduced into the interior processing volume 126 for about 3 seconds to about 30 seconds, for example, about 15 seconds, which varies depending upon the size of the substrate. The flowing of the hydrocarbon-containing gas mixture prior to the introduction of the boron-containing gas can provide continuous thermal and pressure stabilization of the interior processing volume 126. The boron-containing gas mixture is then flowed into the interior processing volume 126 for about 0.5 seconds to about 5 seconds, for example, about 1 seconds to about 2 seconds (the flowing time can vary as long as the flow is long enough for the boron-containing gas mixture to start reaching the interior processing volume 126), prior to striking the RF plasma. It is contemplated that operation 210 can be performed simultaneously with, prior to, after, or partially overlapping with the processes of operation 220.

At operation 230, RF plasma is generated in the interior processing volume 126 to deposit a boron-carbon film 304 on the substrate 190. The plasma can be formed by capacitive or inductive means, and can be energized by coupling RF power into the precursor gas mixture. The RF power can be a dual-frequency RF power using a frequency in a range from about 0.4 MHz to about 300 MHz. For example, the RF power is a dual-frequency RF power that has a high frequency component and a low frequency component. The RF power is typically applied at a power level between about 50 W and about 2,500 W, which can be all high-frequency RF power, for example at a frequency of about 13.56 MHz, or can be a mixture of high-frequency power and low frequency power, for example, at a high frequency of about 13.56 MHz and a low frequency of about 0.35 kHz.

It has been observed that increasing boron doping in boron-carbon films can increase etch selectivity and film transparency while reducing stress of boron-carbon films. While the amount of boron in the boron-carbon films can be increased by increasing the flow of the boron-containing gas mixture (e.g., $B_2H_6$) during the deposition, the hydrogen content in the resulting boron-carbon films will also be increased inevitably. The mechanical strength and etch selectivity of the film can be affected due to the presence of a large amount of hydrogen in the boron-carbon films. However, it has been surprisingly discovered that decreasing the hydrocarbon-containing gas mixture during the deposition can result in increased boron content and reduced hydrogen content in the boron-carbon film 304, when compared to conventionally deposited amorphous carbon layers (e.g., APF™ hardmasks).

Table 1 below depicts various flow combinations of a hydrocarbon-containing gas source and a boron-containing gas source used for forming an amorphous carbon film reference (baseline) and boron-carbon films (cases 1-4). Case 1 is an example where only the hydrocarbon-containing gas source is decreased when compared to the baseline. Case 2 is an example where the hydrocarbon-containing gas source is decreased and the boron-containing gas source is increased when compared to the baseline. Case 3 is an example where only the boron-containing gas source is increased when compared to the baseline. Case 4 is an example where the hydrocarbon-containing gas source is decreased and the boron-containing gas source is increased when compared to the baseline. Table 2 below depicts boron-carbon film properties for the amorphous carbon film reference and boron-carbon films (cases 1-4) formed according to flow combinations shown in Table 1. The percentage of boron incorporation in the boron-carbon films is calculated as follows: (($B/(B+C)$) %).

TABLE 1

| | $C_3H_6$ (sccm) | 9 wt. % $B_2H_6$ in $H_2$ (sccm) |
|---|---|---|
| Baseline | 375 | 2335 |
| Case 1 | 260 | 2335 |
| Case 2 | 165 | 2370 |
| Case 3 | 375 | 3335 |
| Case 4 | 260 | 2835 |

TABLE 2

| Item | Baseline | Case 1 | Case 2 | Case 3 | Case 4 |
|---|---|---|---|---|---|
| Deposition Rate (Å/min) | 5288 | 5352 | 5448 | 6042 | 5752 |
| Non-Uniformity (NU) % | 3.6 | 3.8 | 3.7 | 10.7 | 5.4 |
| Refractive index (n) at 633 nm | 2.32 | 2.37 | 2.44 | 2.24 | 2.33 |
| Extinction Coefficient (k) at 633 nm | 0.046 | 0.041 | 0.039 | 0.031 | 0.038 |
| Stress (MPa) | −12 | −100 | −195 | Tensile | 235 |
| Boron % | 55.2 | 60.8 | 67.8 | 64.6 | 66.96 |

As can be seen in Table 2, the boron incorporation was increased through three different conditions: (a) $C_3H_6$ reduction only (e.g., case 1); (b) $B_2H_6/H_2$ increase only (e.g., case 3); and (c) combination of (1) and (2) (e.g., cases 2 and 4). When the flow rate of the hydrocarbon-containing gas source decreases further (e.g., case 2), the boron content in the final boron-carbon film increases accordingly. However, when the flow rate of the boron-containing gas source greatly increases (e.g., case 3), the boron content in the final boron-carbon film decreases instead. Particularly, the decreased refractive index and the increased film stress suggest that higher content of hydrogen can etch or consume boron, resulting in inefficient boron increase in the final boron-carbon film.

Figure 4:
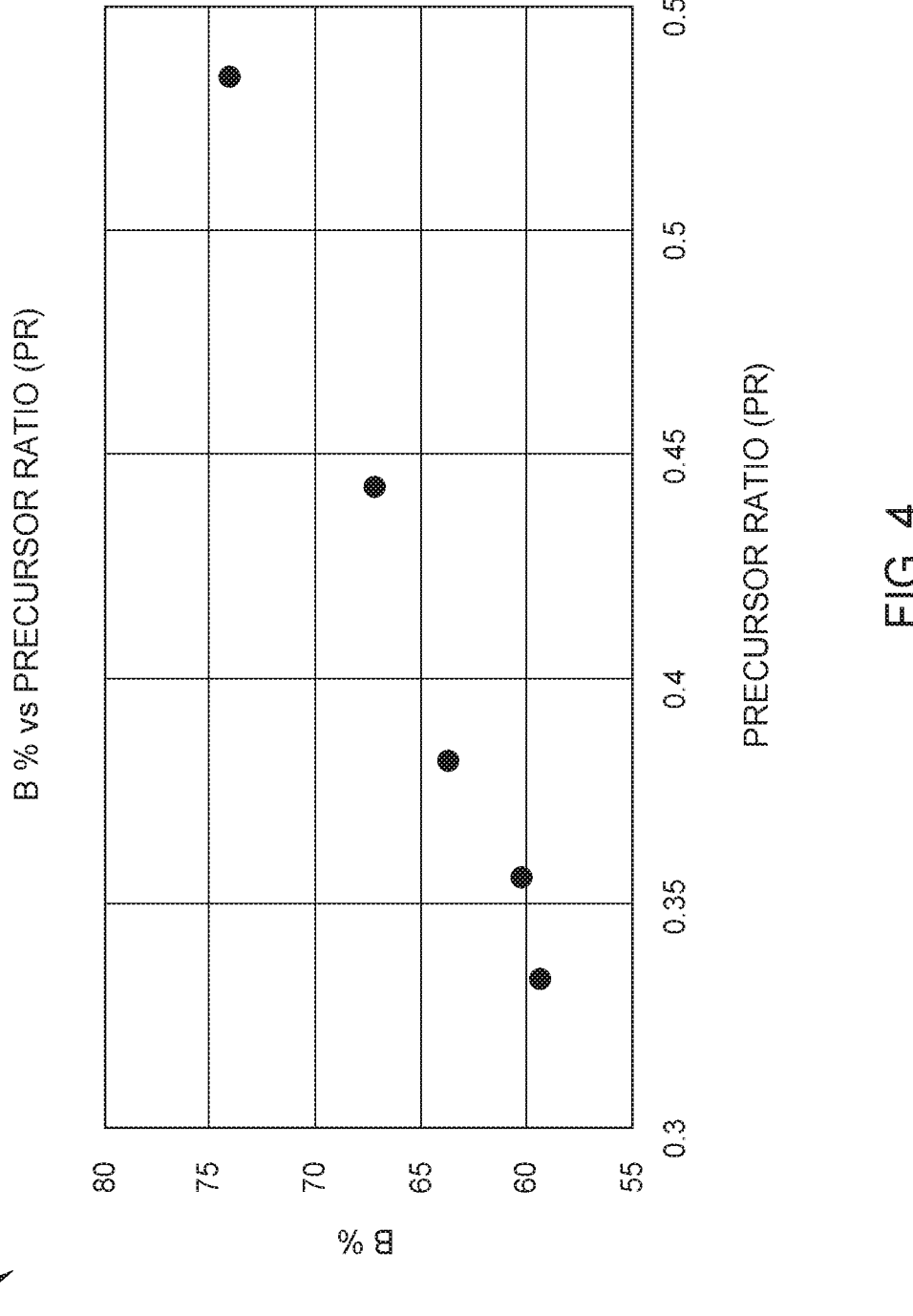
FIG. 4 is a plot illustrating boron (B) percentage with respect to precursor ratio (PR).

FIG. 4 is a plot 400 illustrating boron (B) percentage with respect to precursor ratio (PR). The plot 400 is based on an example where $C_3H_6$ is used as the hydrocarbon-containing gas source and 9 wt. % $B_2H_6$ diluted in $H_2$ is used as the boron-containing gas source. The PR in FIG. 4 is calculated as follows: $PR=(9 \text{ wt. } \% \ B_2H_6 \text{ in } H_2/((9 \text{ wt. } \% \ B_2H_6 \text{ in } H_2)+C_3H_6)$. As can be seen, PR increases as the flow rate of the hydrocarbon-containing gas source decreases (e.g., cases 1 and 2), which in turn results in increased boron doping (B %) in a boron-carbon film. It is contemplated that the precursor ratio discussed herein are equally applicable to other hydrocarbon-containing gas mixtures and boron-containing gas mixtures mentioned in this disclosure. In addition, while the PR is shown varying from 0.3 to 0.55, lower or higher PR is contemplated, depending on the desired boron content in the final boron-carbon films. In various examples, the PR can be in a range from 0.38 to 0.85, for example from about 0.45 to about 0.75. It is proposed that the generated RF plasma is more uniform when the PR of the plasma is increased. The uniformity of the RF plasma corresponds to uniformity of the deposited film. Thus, unexpectedly, increasing the B % of the RF plasma results in a more uniform deposited film.

Since the boron content is directly related to PR, any quantity/percentage of boron in the as-deposited boron-carbon film 304 can be achieved by tuning the PR. In any case, the atomic percentage of boron incorporation in the film can be calculated as follows: ((B/(B+C) %). In various embodiments of the present disclosure, the boron-carbon film 304 contains at least 50, 55, 60, 65, 70, 75, 80, 85, or 90 atomic percentage of boron. In one embodiment, the boron-carbon film 304 contains from about 45 to about 95 atomic percentage of boron. In another embodiment, the boron-carbon film contains from about 55 to about 90 atomic percentage of boron. In yet another embodiment, the boron-carbon film contains from about 60 to about 85 atomic percentage of boron. Likewise, the atomic percentage of carbon incorporation in the film can be calculated as follows: ((C/(B+C) %). In various embodiments of the present disclosure, the boron-carbon film 304 contains at least 10, 15, 20, 25, 30, 35, 40, 45, or 50, atomic percentage of carbon. In one embodiment, the boron-carbon film 304 contains from about 15 to about 55 atomic percentage of carbon. In another embodiment, the boron-carbon film 304 contains from about 25 to about 45 atomic percentage of carbon. In various embodiments, the boron-carbon film 304 contains less than about 10, 15, or 20 atomic percentage of hydrogen. The boron-carbon film 304 can be crystalline or amorphous.

At operation 240, a decision is made as to determine whether the deposited boron-carbon film 304 has reached a target thickness. The boron-carbon film 304 can have a target thickness corresponding to the subsequent etching requirements of the substrate 190. The flowing the hydrocarbon-containing gas mixture into the processing volume (operation 210), the flowing a boron-containing gas mixture into the processing volume (operation 220), and the generating the RF plasma in the processing volume to deposit the boron-carbon film (operation 230) can be repeated until a target thickness is achieved. In one embodiment, the boron-carbon film is deposited to a thickness between about 100 Å and about 30,000 Å (e.g., from about 1,000 Å to about 18,000 Å; from about 100 Å to about 20,000 Å; from about 300 Å to about 5,000 Å; or from about 1,000 Å to about 2,000 Å.)

At optional operation 250, additional processing is performed on the substrate structure 300. For example, a patterned photoresist (not shown) is formed over the boron-carbon film 304. The boron-carbon film 304 can be etched in a pattern corresponding with the patterned photoresist layer followed by etching the pattern into the substrate 190. Material can be deposited into the etched portions of the boron-carbon film 304. The boron-carbon film 304 can be removed using a solution including hydrogen peroxide and sulfuric acid, or any etch chemistries containing oxygen and halogens (e.g. fluorine or chlorine). The boron-carbon film 304 can be removed by a chemical mechanical polishing (CMP) process.

B doping generally reduces $sp^3$ carbon-hydrogen (C—H) bonding in the boron-carbon films. B dopants form at interstitial sites. Neighboring H atoms combine to make hydrogen gas ($H_2$), leaving the film. The remaining C and B atoms then form C—B bonds. It is theorized that $sp^3$ C—H bonds leads to lattice relaxation, resulting in tensile stress. B doping generally increases C═C and C≡C bonding in the boron-carbon films, increasing the C/H ratio. $sp^3$ C—H bonds are also reduced, resulting in compressive stress. Increasing $B_2H_6$ flow can include greater amount of $sp^3$ C—H bonds, leading to higher H content. Shorter chained C molecules are preferred, in order to prevent formation of C—C polymer chains in the film.

Current low temperature boron-containing carbon hardmasks achieve good etch selectivity, mechanical strength, and transparency compared to previous amorphous carbon hardmask films. However, the amorphous nature, higher incorporated hydrogen and lower modulus (~100 GPa) of low temperature boron-containing hardmask films limit fabrication of high aspect-ratio features and smaller dimension devices. To enable next-generation integrated circuit chipsets, embodiments of the present disclosure provide for the fabrication of high-density boron-carbon hardmask films at higher temperatures (e.g., ≥400° Celsius), with increased concentration of boron and lower incorporated hydrogen.

The boron-carbon films, as deposited, have heavily linked boron-carbon (B—C) networks, which protects the boron-carbide film from etchants. Thus, the boron-carbide films exhibit high selectivity with respect to the substrate for further etching processes (either oxide or nitride substrates). The B—C bonds are shorter than carbon-carbon (C—C) bonds, which shifts the boron-carbon film stress towards tensile stress. The boron-carbon films have low stress, resulting in less substrate bowing. The boron-carbon films have high modulus and hardness, making the boron-carbon films mechanically robust. In addition, the B—C bonds increase the band gap of the film. Thus, the boron-carbon films are transparent to at least some of the frequencies of light used in photolithography. Also, reduction of the boron-containing gas mixture leads to lower cost of ownership, as less of the boron-containing gas (e.g., diborane) is needed without reducing desired properties of the films.

In general, the following exemplary deposition process parameters are used to form the boron-containing amorphous carbon layer. The process parameters can range from a substrate temperature of about 400° C. to about 700° C. (e.g., between about 450° C. to about 650° C.). The chamber pressure can range from a chamber pressure of about 1 Torr to about 20 Torr (e.g., between about 2 Torr and about 10 Torr). The flow rate of the hydrocarbon-containing gas (e.g., $C_3H_6$) can be from about 150 sccm to about 400 sccm, for example, about 160 sccm to about 260 sccm. The flow rate of a dilution gas (e.g., He) can individually range from about 0 sccm to about 3,000 sccm (e.g., from about 1,200 sccm to about 2,000 sccm). The flow rate of an inert gas (e.g., Ar) can individually range from about 0 sccm to about 10,000 sccm (e.g., from about 2,500 sccm to about 4,000 sccm). The flow rate of the boron-containing gas mixture (e.g., from about 6 wt. % to about 10 wt. % $B_2H_6$ diluted in $H_2$) can be from about 1,000 sccm to about 3,500 sccm, for example, about 1500 sccm to about 2300 sccm. The high-frequency RF power can be between 1,000 W and 3,000 W, for example, about 2,000 W. The low-frequency RF power can be between about 0 W and about 1,500 W, for example, about 800 W. The spacing between the surface 191 of the substrate 190 (e.g., the top surface) and the gas distribution assembly 120 can be between about 100 mm to about 600 mm (e.g., between about 150 mm to about 400 mm). The power voltage for the ESC can be between about 0 V and about 1000 V, for example, about 600 V to about 750 V. The boron-carbon film can be deposited to a thickness between about 100 Å and about 30,000 Å, for example, about 1,000 Å to about 18,000 Å. The above process parameters provide a typical deposition rate for the boron-containing amorphous carbon layer in the range of about 100 Å/min to about 10,000 Å/min and can be implemented on a 300 mm substrate in a deposition chamber available from Applied Materials, Inc. of Santa Clara, CA.

The as-deposited boron-carbon film 304 can have a refractive index (n) at a 633 nm wavelength of greater than about 2, for example, about 2.34. The as-deposited boron-carbon film 304 can have an extinction coefficient (k) at a 633 nm wavelength of less than about 0.1, for example, 0.04 or less. The as-deposited boron-carbon film 304 can have an elastic modulus of about 150 MPa to about 400 MPa. The as-deposited boron-carbon film 304 can have a stress of about −200 MPa to about 200 MPa (e.g., about −50 MPa to about 100 MPa). The as-deposited boron-carbon film 304 can have a density of greater than 1.5 g/cc, for example, about 1.85 g/cc.

As described above, a method for processing a substrate is provided. The method includes the fabrication of high-density boron-carbon hardmask films with increased concentration of boron and lower incorporated hydrogen. Decreasing the flow rate of the hydrocarbon-containing gas source increases the B % in the boron-carbon hardmask film.

The boron-carbon hardmask films provide high modulus, etch selectivity, and stress for high aspect-ratio features (e.g., 10:1 or above) and smaller dimension devices (e.g., 7 nm node or below). Embodiments described herein are compatible with current carbon hard mask process integration schemes. Thus, introduction of the methods into existing device manufacturing lines will not require substantial changes in upstream or downstream processing methods or equipment related thereto.

While the foregoing is directed to embodiments of the present disclosure, other and further embodiments of the disclosure may be devised without departing from the basic scope thereof, and the scope thereof is determined by the claims that follow.

The invention claimed is:

1. A method of processing a substrate, comprising:
   exposing the substrate positioned in a processing volume of a processing chamber to a hydrocarbon-containing gas mixture;
   exposing the substrate to a boron-containing gas mixture comprising from about 1 to 20 weight percentage (wt. %) diborane ($B_2H_6$) diluted in hydrogen gas ($H_2$), wherein the hydrocarbon-containing gas mixture and the boron-containing gas mixture are flowed into the processing volume at a precursor volume ratio of (boron-containing gas mixture/((boron-containing gas mixture)+hydrocarbon-containing gas mixture) of about 0.38 to about 0.85; and
   generating a radio frequency (RF) plasma in the processing volume to deposit a boron-carbon film on the substrate, wherein the boron-carbon film has at least 75 atomic percentage of boron.

2. The method of claim 1, wherein the hydrocarbon-containing gas mixture comprises an alkane.

3. The method of claim 2, wherein the hydrocarbon-containing gas mixture comprises propylene ($C_3H_6$).

4. The method of claim 1, wherein the boron-containing gas mixture comprises about 9 weight percentage (wt. %) diborane ($B_2H_6$) diluted in hydrogen as ($H_2$).

5. The method of claim 1, wherein a volume ratio of the hydrocarbon-containing gas mixture to the boron-containing gas mixture is in a range between about 0.07:1 and about 0.12:1.

6. The method of claim 1, wherein a pressure in the processing volume is between 2 Torr and 10 Torr.

7. The method of claim 1, wherein the substrate is maintained at a temperature from about 450° C. to about 650° C.

8. The method of claim 1, wherein the generating the RF plasma comprises applying a high frequency of about 12 MHz to about 14 MHz and a low frequency of about 0.1 KHz to about 1 kHz.

9. The method of claim 8, wherein the applying a high and low frequency is applied at a power level between about 50 W and about 2,500 W.

10. The method of claim 1, wherein the boron-containing gas mixture comprises from about 5 to about 12 weight percentage (wt. %) diborane ($B_2H_6$) diluted in hydrogen as ($H_2$).

11. The method of claim 1, wherein the boron-carbon film has at least 80 atomic percentage of boron.

12. The method of claim 1, wherein the boron-carbon film has at least 85 atomic percentage of boron.

13. The method of claim 1, wherein the boron-carbon film has at least 90 atomic percentage of boron.

14. A method of processing a substrate, comprising:

exposing the substrate positioned in a processing volume of a processing chamber to a hydrocarbon-containing gas mixture;

exposing the substrate to a boron-containing gas mixture comprising from about 2 to 18 weight percentage (wt. %) diborane ($B_2H_6$) diluted in hydrogen gas ($H_2$), wherein the hydrocarbon-containing gas mixture and the boron-containing gas mixture are flowed into the processing volume at a precursor volume ratio of (boron-containing gas mixture/((boron-containing gas mixture)+hydrocarbon-containing gas mixture) of about 0.38 to about 0.85; and generating a radio frequency (RF) plasma in the processing volume to deposit a boron-carbon film on the substrate, wherein the boron-carbon film has at least 75 atomic percentage of boron.

15. The method of claim 14, wherein the generating the RF plasma comprises applying a high frequency of about 12 MHz to about 14 MHz and a low frequency of about 0.1 kHz to about 1 KHz.

16. The method of claim 15, wherein the applying a high and low frequency is applied at a power level between about 50 W and about 2,500 W.

17. The method of claim 14, wherein the boron-containing gas mixture comprises about 9 weight percentage (wt. %) diborane ($B_2H_6$) diluted in hydrogen gas ($H_2$).

18. The method of claim 14, wherein a volume ratio of the hydrocarbon-containing gas mixture to the boron-containing gas mixture is in a range between about 0.07:1 and about 0.12:1.

19. The method of claim 14, wherein the substrate is secured to an electrostatic chuck (ESC).

20. A non-transient computer readable medium, the medium containing program instructions for causing a computer to perform the method of:

exposing a substrate positioned in a processing volume of a processing chamber to a hydrocarbon-containing gas mixture;

exposing the substrate to a boron-containing gas mixture comprising from about 5 to 12 weight percentage (wt. %) diborane ($B_2H_6$) diluted in hydrogen gas ($H_2$), wherein the hydrocarbon-containing gas mixture and the boron-containing gas mixture are flowed into the processing volume at a precursor volume ratio of (boron-containing gas mixture/((boron-containing gas mixture)+hydrocarbon-containing gas mixture) of about 0.38 to about 0.85; and generating a radio frequency (RF) plasma in the processing volume to deposit a boron-carbon film on the substrate, wherein the boron-carbon film has at least 75 atomic percentage of boron.

21. The non-transient computer readable medium of claim 20, wherein the hydrocarbon-containing gas mixture comprises an alkane.

22. The non-transient computer readable medium of claim 21, wherein the hydrocarbon-containing gas mixture comprises propylene ($C_3H_6$).

23. The non-transient computer readable medium of claim 20, wherein the boron-containing gas mixture comprises about 9 weight percentage (wt. %) diborane ($B_2H_6$) diluted in hydrogen gas ($H_2$).

24. The non-transient computer readable medium of claim 20, wherein a volume ratio of the hydrocarbon-containing gas mixture to the boron-containing gas mixture is in a range between about 0.07:1 and about 0.12:1.

* * * * *